United States Patent
Acker (10) Patent No.: US 10,690,518 B2
(45) Date of Patent: Jun. 23, 2020

(54) DEVICE FOR MEASURING A MEASUREMENT VARIABLE

(71) Applicant: Continental Teves AG & Co. oHG, Frankfurt (DE)

(72) Inventor: Heinrich Acker, Schwalbach (DE)

(73) Assignee: Continental Teves AG & Co. oHG (DE)

(*) Notice: Subject to any disclaimer, the term of this patent is extended or adjusted under 35 U.S.C. 154(b) by 195 days.

(21) Appl. No.: 16/074,882

(22) PCT Filed: Feb. 28, 2017

(86) PCT No.: PCT/EP2017/054617
§ 371 (c)(1),
(2) Date: Aug. 2, 2018

(87) PCT Pub. No.: WO2017/157652
PCT Pub. Date: Sep. 21, 2017

(65) Prior Publication Data
US 2019/0056245 A1 Feb. 21, 2019

(30) Foreign Application Priority Data
Mar. 17, 2016 (DE) .................. 10 2016 204 417

(51) Int. Cl.
*G01D 5/20* (2006.01)
*H03M 1/20* (2006.01)

(52) U.S. Cl.
CPC ........... *G01D 5/2073* (2013.01); *G01D 5/204* (2013.01); *H03M 1/201* (2013.01)

(58) Field of Classification Search
CPC ........ G01D 5/20; G01D 5/2073; G01D 5/204; G01D 5/2043; G01D 5/2046; G01D 5/2053; G01D 5/243; G01D 5/225; H03M 1/20; H03M 1/201
See application file for complete search history.

(56) References Cited

U.S. PATENT DOCUMENTS

| | | | |
|---|---|---|---|
| 5,027,066 A | 6/1991 | Reder | |
| 5,451,947 A | 9/1995 | Morrison | |
| 5,952,822 A | 9/1999 | Kayserman et al. | |
| 6,268,814 B1 * | 7/2001 | Kolsrud | H03M 1/0641 341/131 |
| 8,339,126 B2 | 12/2012 | Izak et al. | |
| 2003/0107377 A1 | 6/2003 | Uzman | |

(Continued)

FOREIGN PATENT DOCUMENTS

| | | |
|---|---|---|
| CA | 2720270 A1 | 2/2009 |
| DE | 3903278 A1 | 8/1990 |
| DE | 69322762 T2 | 6/1999 |

(Continued)

OTHER PUBLICATIONS

German Search Report for German Application No. 10 2016 204 417.6, dated Jan. 30, 2017, with partial translation—13 pages.

(Continued)

*Primary Examiner* — Son T Le
(74) *Attorney, Agent, or Firm* — RatnerPrestia (57) ABSTRACT

An apparatus for measuring a measured variable, wherein a first inductance and at least one measurement inductance are coupled, and wherein dithering is used to increase accuracy.

17 Claims, 3 Drawing Sheets

(56) References Cited

U.S. PATENT DOCUMENTS

2014/0132431 A1  5/2014  Steensgaard-Madsen
2018/0188076 A1  7/2018  Acker

FOREIGN PATENT DOCUMENTS

| DE | 10128010 A1 | 1/2003 |
| DE | 102008015837 A1 | 10/2009 |
| EP | 0520662 A2 | 12/1992 |
| EP | 2105713 A1 | 9/2009 |
| EP | 2765391 A2 | 8/2014 |
| JP | 05276042 A | 10/1993 |
| JP | 2004128902 A | 4/2004 |
| WO | 2017025354 A1 | 2/2017 |

OTHER PUBLICATIONS

International Search Report and Written Opinion for International Application No. PCT/EP2017/054617, dated May 12, 2017—11 pages.
Korean Decision to Grant a Patent for Korean Application No. 10-2018-7024501, dated Jan. 31, 2020 with translation, 3 pages.

\* cited by examiner

DEVICE FOR MEASURING A MEASUREMENT VARIABLE

CROSS REFERENCE TO RELATED APPLICATIONS

This application is the U.S. National Phase Application of PCT International Application No. PCT/EP2017/054617, filed Feb. 28, 2017, which claims priority to German Patent Application No. 10 2016 204 417.6, filed Mar. 17, 2016, the contents of such applications being incorporated by reference herein.

FIELD OF INVENTION

The invention relates to an apparatus for measuring a measured variable. By way of example, this may be an apparatus that can also be referred to as a sensor. By way of example, such an apparatus may be designed to pick up a measured variable in the form of a distance, for example in order to establish the position of a pedal in an automobile.

BACKGROUND OF THE INVENTION

Known apparatuses have various disadvantages. By way of example, scaling to multiple inputs is possible for the most part only with a high level of outlay. In addition, the accuracy of the capture of a measured variable is frequently limited by the available bit width of an analog-to-digital converter in a microcontroller that is used. Although known dithering, for example, in which the application of a fast overlay signal allows more accurate measurement than the actual bit width of an analog-to-digital converter does, can provide a remedy in this case, this is associated with a high level of additional circuit complexity in the case of known embodiments.

Although the respective additional outlay required is fundamentally feasible from a technical point of view, the apparatuses described here are mass-produced products for which the costs of manufacture play a significant part.

SUMMARY OF THE INVENTION

An aspect of the invention is an apparatus for measuring a measured variable that is embodied alternatively, for example in more cheaply manufacturable fashion.

An aspect of the invention relates to an apparatus for measuring a measured variable. The apparatus has a first inductance. Moreover, the apparatus has at least one measurement inductance that is set up to sense the measured variable and that is coupled to the first inductance. This may be either one measurement inductance or a plurality of measurement inductances, for example two, three, four or more measurement inductances.

By way of example, the measured variable may be a distance covered by a technical element, such as a pedal in an automobile or a component of a suspension, for example, or a position adopted by such an element.

In addition, the apparatus has a capacitance that is interconnected with the first inductance to form a parallel resonant circuit. Moreover, the apparatus has an electronic control unit. The electronic control unit is connected directly to the parallel resonant circuit and is configured to excite the parallel resonant circuit into oscillation at an excitation frequency that is derived from a clock of the electronic control unit.

By way of example, the electronic control unit may be a microcontroller, a microprocessor, an application-specific integrated circuit (ASIC), a field programmable gate array (FPGA) or another programmable or hardwired component.

By way of example, a direct connection to the parallel resonant circuit may be embodied exclusively for the use of wires or other electrically conductive connections, but it can also include components such as resistors, for example. The exciting at an excitation frequency sets the parallel resonant circuit oscillating. By way of example, a clock of the electronic control unit can come from an internal oscillator, an external oscillator, an internal or external clock source or from another source. Finally, the excitation at an excitation frequency derived from a clock of the electronic control unit typically means that the excitation frequency is prescribed by the electronic control unit.

The electronic control unit has an analog-to-digital converter having at least one signal input connected directly to the at least one measurement inductance for picking up a signal. This allows pickup of a voltage value from the measurement inductance. The voltage value is typically the signal. It should be understood that, by way of example, the electronic control unit may also have multiple analog-to-digital converters having a respective signal input, each signal input being able to be connected to a respective measurement inductance when there are multiple measurement inductances present. Similarly, however, it is also possible for, by way of example, one analog-to-digital converter to be interconnected with multiple measurement inductances via a multiplexor.

The electronic control unit has a distortion signal generator having a distortion signal output, the distortion signal generator being designed to deliver a distortion signal at a distortion signal reference point. This distortion signal allows use of dithering in order to refine the resolution of the analog-to-digital converter beyond the possible resolution derived purely on the basis of its bit width. In this case, the distortion signal reference point may either be directly at a pin or an output of the electronic control unit, but it may also be in external circuitry of the electronic control unit, as will be described later on by way of example.

The distortion signal output is coupled to the analog-to-digital converter exclusively by means of passive components. The inventor of the present application has recognized that coupling the distortion signal output to the analog-to-digital converter does not necessarily require active components, such as an operational amplifier, for example. Rather, it is also entirely possible, as described here, to couple the distortion signal output to the analog-to-digital converter exclusively by means of passive components, that is to say to overlay the distortion signal with a signal to be measured, resulting in a considerable saving of costs in comparison with the use of active components.

The electronic control unit is configured to measure the signal at intervals, a number of measured values being picked up within each interval. In addition, the electronic control unit is configured to perform a frequency analysis of the measured values of a respective interval and to determine at least one characteristic value, indicating the measured variable, of the signal at an evaluation frequency.

The frequency analysis described allows a characteristic value indicating the measured variable to be obtained in a particularly advantageous manner, allowance also being able to be made for special situations in respect of the frequencies used, in particular. This will be discussed in more detail later on.

The apparatus according to an aspect of the invention can be used to measure a measured variable in a particularly efficient and inexpensive manner. In this context, it is possible both for almost arbitrary scaling to be effected in respect of the number of measurement inductances used and for a resolution to be achieved that is significantly better than the resolution to be surmised from the bit width of the analog-to-digital converter. All of this is possible with minimum outlay and minimum costs.

The measured values are preferably spaced apart by respective time differences, these being consistent with an undersampling of the signal. Such an undersampling can advantageously be used in order to measure frequencies that are significantly above the otherwise possible maximum frequencies. High frequencies of this kind may be beneficial specifically in the situation of measurement using measurement inductances that is described here, since the transmission of an AC voltage according to the transformer principle results in the induced voltage and hence also the accuracy of the measurement becoming all the greater the higher the frequency.

According to one embodiment, the evaluation frequency is the excitation frequency. This is consistent with a particularly simple embodiment, in particular.

According to one embodiment, the evaluation frequency is an alias of the excitation frequency. This takes into consideration the effect of aliasing, in particular. In particular as a result of this, the excitation frequency may be much higher than the frequency that would otherwise be measurable with the described situation without taking into consideration undersampling.

Productive use of aliasing, which is otherwise for the most part disruptive, preferably takes place as follows: at the input of the analog-to-digital converter there is a signal at the excitation frequency that undergoes undersampling by virtue of the sampling rate on the analog-to-digital converter. Without further signal processing steps, the output of the analog-digital converter produces a signal spectrum in which the excitation frequency is transformed to a value below the Nyquist frequency of the sampling rate of the analog-to-digital converter. This value is preferably consistent with the evaluation frequency measured by the spectral evaluation of the output signal of the analog-to-digital converter.

Preferably, a respective measurement interval comprises an integer number of periods of the signal. This allows a particularly advantageous frequency analysis.

Preferably, a respective measurement interval has an integer number of half-cycles of the distortion signal. As a particular preference, it has one or two half-cycles. This ensures that, in particular when a deterministic distortion signal is used, no corruption of the measurement result by the distortion signal takes place.

Preferably, the distortion signal output is coupled to the analog-to-digital converter without active components, in particular without operational amplifiers. This wording can be used as an alternative to the wording that the distortion signal output is coupled to the analog-to-digital converter exclusively using passive components. Accordingly, these wordings can also be interchanged.

The measurement inductances preferably have a respective first pole connected to a respective signal input of the electronic control unit. As a further preference, they have a respective second pole connected to a common potential point. This allows the measurement inductances to be supplied with a common, adjustable potential.

At least approximately or else exactly half the supply voltage of the electronic control unit may be present at the potential point. This has been found to be advantageous because in this case disparities can ideally be measured in both directions.

Preferably, the potential point is the distortion signal reference point. This can mean in particular that the distortion signal is overlaid on a desired, at least approximately adjustable potential at the potential point. The potential point may in this case be in particular the output point for a further signal modulation in the measurement inductances on the basis of the measured variable. As such an output point, the potential point as a distortion signal reference point has the distortion signal overlaid on it, said distortion signal therefore already being contained in the signal to be changed by the measured variable.

The distortion signal output and the potential point may in particular have a resistor connected between them, the potential point being connected to a reference-ground potential or to the supply voltage via a smoothing capacitor. As a result, the distortion signal output can be used to set the potential at the potential point. In particular, this can be effected by means of a pulse width modulation.

Accordingly, a pulsed signal that may in particular have a prescribable duty ratio may preferably be present at the distortion signal output.

The characteristic value may in particular be an amplitude, a phase, a real part and/or an imaginary part. Any desired combination of one of these values, two of these values, three of these values or all values can be used. The characteristic value can thus also have multiple components, for example it can have amplitude and phase as components or it can have real part and imaginary part as components. By way of example, it can also have amplitude, phase, real part and imaginary part and any other subgroup of the aforementioned values and also further values. Essentially, the composition of the characteristic value, possibly also as a multidimensional or multicomponent variable, will depend on the respective application.

Multiple general embodiments for aspects of the invention are provided below, and it should be mentioned that all embodiments, features and variants described below can be combined with the embodiments, features or variants otherwise described in this application as desired.

Microcontrollers are an integral part of many sensor systems because sensor functions of the signal processing, such as filtering or disturbance variable rejection, for example, can be flexibly and inexpensively represented digitally in software. Since the actual sensor system showing the physical parameter dependency of the measured variable can practically always be interpreted as analog, an analog-to-digital converter (ADC) has central significance in the sensor system. Most microcontrollers contain integrated analog-to-digital converters because the joint realization of the necessary components in an integrated circuit helps to reduce system costs.

Analog-to-digital converters integrated in microcontrollers have for the most part bit widths or word lengths of 8 to 12 bits. Most prevalent on the market are systems having 10 bits. In case of standalone analog-to-digital converters, on the other hand, word lengths of 12 to 16 bits are highly prevalent. The reason for the difference is the difficulty in integrating high-quality analog electronic components together with the microcontroller on an integrated circuit (IC) inexpensively. This limits the effective resolution (ENOB), and manufacturers seek to set the word length higher, but not distinctly higher than the effective resolution.

A word length or effective resolution of 10 bits is not adequate for many applications. By contrast, the analog-to-digital converters in modern microcontrollers often have a maximum sampling rate of 100 kHz to 200 kHz, while the bandwidth of the measured variables in sensors in the automotive sector is for the most part below 1 kHz. Distinct oversampling of the measured variable is thus possible. It is thus possible to consider producing few values with a high resolution from many values with a low resolution. One known method in this regard is what is known as "dithering". This involves noise with a low RMS value in the order of magnitude of a few LSB (least significant bits) being added to the input signal. The result is that the output value assumed by the analog-to-digital converter for a constant input signal becomes random. It oscillates around the value corresponding to the input signal and having the instantaneous value of the noise. If the noise has the mean value zero, then the mean value of many output values from the analog-to-digital converter will be consistent with the specific output value of the constant input signal, but the mean value has a higher resolution. The reason is that places (digits) having a lower significance than an LSB are produced during averaging. This method is called "random dithering".

"Random dithering" achieves the stated object, but the gain in effective resolution when only a small number of, by way of example, 50 output values from the analog-to-digital converter are combined is likewise only small, because the noise cannot have adequate stochastic uniformity with such a small number of values. This can mean in particular that the mean value of each group of, by way of example, 50 successive values for the noise differs significantly from zero. Thus, instead of genuine noise, i.e. the values of an actually random process, pseudo-noise can frequently be used, i.e. a quasi-random series of values that, however, have actually been shaped such that the desired stochastic properties are provided for each group, in particular a mean value of zero. The performance in the cited context is for this reason distinctly higher with a constant, small number of output values from the analog-to-digital converter than in the case of "random dithering". This known method is called "deterministic dithering".

The manner of operation of "deterministic dithering" does not require the added dither signal or distortion signal to seem like noise. When the step from "random dithering" to "deterministic dithering" has been completed, it is noticeable that even a simple defined signal such as a triangular-waveform or sawtooth signal, for example, meets the requirements. In this case, to satisfy the main condition of a mean value equal to zero, it is merely important that the period from which the samples that are averaged to produce a value come comprises an integer number of periods of the dither signal or distortion signal. It is typically actually even sufficient if the mean value is constant and known, because any such value can be removed again at the digital end by computation.

Achieving these aspects requires the following components, according to the prior art:
1. generator for the distortion signal,
2. adder
3. analog-to-digital converter (ADC),
4. microcontroller (forms mean value).

Moreover, in order to satisfy the condition of the integer number of periods of the distortion signal, synchronisation of the generator and the analog-digital converter is intended to take place.

Since, as already mentioned, analog-to-digital converters and microcontrollers are typically integrated, a solution based on the prior art consists of the microcontroller and also the adder and a generator as external components.

In particular, a solution based on the prior art can have one adder per channel for the case of a multichannel measurement system. Therefore, the circuit complexity increases distinctly with the number of channels, which means that multichannel systems, which are attractive in respect of their measurement properties, lose at least some of this attractiveness again via the costs.

As the inventor of the present application has recognized, the function of an adder can be achieved with merely passive external circuitry for a microcontroller. However, in particular for the frequent case in which neither a differential input of the analog-to-digital converter is present nor a reference input of the analog-to-digital converter can be used, one passive adding circuit per channel will be constructed in this case. As a result, the overall circuit given a larger number of channels is still relatively inexpensive in comparison with the prior art (summing amplifier), but the circuit still consists of a multiplicity of devices whose total costs, not least on account of component fitting and occupied circuit board area, still make further optimization seem useful.

Additionally, it appears useful to achieve universal usability, in particular by virtue of frequency bands of the distortion signal and the signal to be measured no longer being separated.

The use of dithering based on the prior art has the limitation that the signal to be measured can change only negligibly in each time interval whose mean value is formed. However, it would be desirable to achieve the positive properties of dithering, in particular of "deterministic dithering", with distinctly reduced external circuitry for the microcontroller and thereby to save costs, the limitations described being supposed to be dispensed with.

First of all, it is proposed that an adder be replaced.

Without an adder, there is no direct possibility of adding the distortion signal to the input signal. If the analog-to-digital converter has a differential input and the input signal is referenced to ground, however, subtraction can take place by virtue of the input signal being applied to the positive input and the distortion signal being applied to the negative input, or vice versa. Subtraction is equivalent to addition in this case, because the arithmetic sign of the distortion signal can be chosen freely. This simple partial solution (A1) to the addition problem is inexpensive to realize. However, it is problematic in particular if an integrated analog-to-digital converter already has a ground-referenced input, i.e. the negative input is internally permanently connected to ground potential.

By contrast, almost all analog-to-digital converters have a reference input to which a DC voltage can be connected that serves as a reference variable for the conversion by the analog-to-digital converter. This input does not necessarily have to be routed to the outside for the basic operation of an integrated analog-to-digital converter; an internal connection from the power supply to the reference input would typically suffice in this case. In fact, the reference input is accessible from the outside in many cases, however, even if the manufacturer dictates that the supply voltage should be applied there. The reason is that the isolation of the connections allows the EMC behavior of the system to be improved. There is therefore the possibility of applying a voltage there that is the sum of a regular reference DC voltage and a distortion signal (partial solution A2). This solution is almost universally usable for the desired properties of the analog-to-digital converter or microcontroller, but not for the processed signals, since, from a mathematical point of view, the input signal is divided by the reference voltage in the analog-to-digital converter in order to obtain a number that, when rounded as an integer, represents the output value. If a distortion signal is now connected to the reference input, this is no longer the known operation "dithering", i.e. addition of an auxiliary variable to the input signal. Instead, the addition of the auxiliary variable to a third variable (reference voltage) and division of the input signal by this sum is a novel operation with somewhat different technical properties.

The distortion signal can be chosen for this novel operation preferably according to the same criterion as with conventional dithering: the output of the analog-to-digital converter is supposed to cover few LSBs, i.e. fluctuate between few adjacent values, when a DC voltage is used as the input signal. The magnitude of the distortion signal in proportion to the input signal cannot be used to make a generally valid statement, because analog-to-digital converters have totally different magnitudes of reference signals in comparison with the input voltage range.

The difference between conventional dithering and the novel operation is in particular that division does not deliver good results over the entire input voltage range of the analog-to-digital converter. In typical instances of application, the properties of conventional dithering are achieved approximately with large input signals that exhaust the input voltage range of the analog-to-digital converter, while the benefit becomes ever smaller with a small input signal until finally a harmful effect occurs with a signal close to zero. The cause is that the distortion signal then becomes large in comparison with the input signal. The novel operation is therefore in particular suitable for systems in which no signals having a small amplitude occur. This is the case with many sensor systems that use an intermediate variable for transmitting the sensor information, such as in the case of sensors for distance or angle that work according to magnetic operating principles, for example. In many of these sensors, the measured variable modulates a magnetic field, very small amplitudes of the magnetic field being undesirable anyway on account of the signal-to-noise ratio, which is then poor. Overall, the novel operation does not achieve the results of conventional dithering completely in many cases. Its benefit can be derived from the following comparison, however, which is typical of the frequency and bandwidth circumstances described at the outset. There are accordingly three design alternatives for a typical sensor system:
1. no dithering, 10-bit resolution, basic costs
2. conventional dithering, 14-bit resolution, distinctly increased costs
3. dithering based on partial solution A2, 13-bit resolution, minimally increased costs The comparison makes it clear that all systems for which the improvement to 13 bits, for example, is sufficient can benefit from dispensing with the adder (i.e. normally an operational amplifier IC).

A further way of performing dithering without an adder is to provide different types of coupling of the distortion signal and the input signal on the analog-to-digital converter (partial solution A3). This solution is likewise very inexpensive to implement and has the advantage of being usable for the entire range of input amplitudes, but the frequencies need to be looked at specifically.

The different types of coupling are in particular DC voltage coupling (also called conductive coupling, i.e. only resistors between coupled nodes) and AC voltage coupling (i.e. capacitances between the coupled nodes, generally also inductances, with capacitances typically being preferred). A node of an electronic circuit, in this case the input of the analog-to-digital converter, can have a DC voltage coupling to one source and an AC voltage coupling to another source. The sources then differ in the frequency band in which they make the predominant contribution to the input voltage of the analog-to-digital converter. These frequency bands of the two sources need to be sufficiently separate from one another for the desired effect to occur. Taking into consideration that the distortion signal is typically an AC voltage, there are the following options, for example:
1. The measured variable contains components down to the frequency zero. A DC voltage coupling is then advantageously used therefor. The higher-frequency distortion signal is advantageously added by AC voltage coupling, in particular capacitive coupling.
2. The measured variable has a lower frequency limit that differs distinctly from zero. This occurs in particular in systems in which a modulation method is used. The high-frequency measured variable can be coupled by AC voltage coupling, in particular capacitive coupling. The low-frequency distortion signal can be added by DC voltage coupling. In this case, the digital signal processing is preferably not simple averaging, but rather preferably demodulation of the AC voltage signal will take place at the input. Various algorithms can be used for this.

A further option is to add the voltage of the distortion signal and that of a signal source to be measured by means of a series connection at a single input of the analog-to-digital converter. In this regard, preferably at least one of the sources has the property of not being referenced to ground. For the case of a signal source, this is in particular possible with sensors that are a voltage source with connections at zero potential with respect to the rest of the circuit, i.e. the connections do not have a stipulated potential with respect to this circuit. Thus, such signal sources can be connected in series with a ground-referenced source of the distortion signal.

This relates in particular to inductive sensors operating based on the transformer principle, that is to say in which one or more inductances are provided that are supplied with current (primary inductance) in order to produce a magnetic field, and one or more other, magnetically coupled inductances (secondary inductances) on which the induced voltage, which is dependent on the measured variable and influences the magnetic field, is measured (for example referred to as measurement inductances).

Of particular advantage is a design having multiple secondary inductances or multiple measurement inductances if these are each connected to one another by a pole, the measurement of the induced voltage not being limited in any manner. It is then possible for a pole connecting all inductances to be used to connect a single voltage source of the distortion signal, while the other pole of each secondary inductance or measurement inductance is available for measuring the respective induced voltage. This pole may be the potential point and/or the distortion signal reference point already mentioned earlier on, for example.

In addition, there may be an integrated generator provided.

Almost every microcontroller has one or more timers or counters that can interact with its digital outputs. The possible types of interaction differ in the particulars. A typical function that can be found very frequently is that whenever the counter overflows a flip-flop connected to a digital output changes its state. The counter is subsequently reloaded with a starting value and the process starts over. Ultimately, this arrangement can be used to produce a square-wave voltage at a programmable frequency. The attainable frequencies are in the range from <1 Hz to >1 MHz, for example. Since the counter is controlled by the clock of the clock oscillator of the microcontroller, the square-wave voltage can easily be synchronized to the ADC, for which the same applies. Therefore, the condition of synchronism can easily be satisfied using the means of the microcontroller. However, a square-wave voltage is frequently not optimum as a distortion signal, because the effect of dithering, of course, is based distinctly on the distortion signal assuming many different values so that during the averaging of the output values of the analog-to-digital converter an altered distribution of the output values is produced for just a small change in the input signal. A square-wave voltage has only two values and typically cannot accomplish this. Moreover, the amplitude of the square-wave voltage is frequently too high, because the digital output has its stable values close to the positive and negative supply voltages as a rule.

The square-wave voltage is therefore preferably reshaped and attenuated so that many different values (intermediate values) are assumed while retaining the synchronism within each period. In this regard, a filter or integrator and/or a voltage divider or series resistor can be used, for example. Active filters are preferably not considered in this case, because this would increase the costs. Instead, preferably only passive RC networks are used for filtering and adapting amplitude and possibly mean value. Dispensing with active filters acts as a disadvantage at first, because exact triangular-waveform or sawtooth signals cannot be produced in this way. However, an examination of the relationship between the curve shape of the distortion signal and the effectiveness of the dithering has shown that an even distribution of the voltage values is not required. Dithering can thus also take place with the periodic sequence of sections of the e-function that appears at the output of an RC element, to which a square-wave signal is applied, as filter.

For an advantageous design, care should be taken to ensure that the output voltage differs sufficiently at successive sampling times. Sufficiently is deemed to mean in particular satisfaction of the criterion for covering multiple adjacent output values of the analog-to-digital converter in the measurement interval. Each time interval should be involved in producing this distribution of output values, otherwise effectively no dithering takes place in this interval. In that case, although the relevant system would still measure valid values, the resolution would remain below the possibilities shown.

Any implementation of the solution to the problem preferably consists of a generator network and one of the partial solutions A1, A2 or A3 or the solution just described. A sensor system having multiple measurement channels can also contain multiple such arrangements, each measurement channel being able to have standalone circuitry or being able to use individual parts with different measurement channels jointly. In this case, switches are preferably provided that make and break the necessary connections. A typical example is the use of a multiplexer at the input of an ADC, which is thus available to multiple channels. In addition, signal processing and handling of AC voltage signals may be provided.

When considering dithering based on the prior art, it is—often tacitly—presupposed that the signal to be measured is constant within a measurement interval. The measurement interval is the time from which the individual measurements that are combined to produce a high-resolution result originate. The constant signal is tacitly assumed by virtue of the averaging being used in the measurement interval, since although the averaging results in an increase in the resolution of the result even in the event of a signal change, it also results in corruption of the result with respect to the signal. The reason is the action of the averaging as a low-pass filter, i.e. higher-frequency components in the signal are rejected.

If the signal to be measured changes very quickly, as is frequently the case e.g. with inductive sensors, then the ADCs in microcontrollers can barely still be used to perform dithering based on the prior art, because the change in the signal is high and in no way negligible just in the time interval between two successive samples at the highest sampling rate. If e.g. the maximum sampling rate is 200 kHz, then changes in the signal within 50·1/200 kHz=250 ps must be negligible for a measurement interval comprising e.g. 50 samples. If 1/20th of a signal period is now set for 'negligible', then the following is obtained for the maximum frequency for which dithering can take place under the specified conditions: 1/250 μs·1/20=200 Hz. The stipulation of 1/20th of a signal period may appear arbitrarily low, but a signal such as a sine, for example, changes by no more than twice the amplitude in just half a signal period. In one tenth of this time period, this is on average 20% of the amplitude, distinctly more at the zero crossing. Considering these values to be negligible may already be problematic for some applications. Dithering in the known form is therefore limited to low signal frequencies for signal processing with simple microcontrollers.

Conversely, inductive sensors are particularly effective distinctly at higher operating frequencies, because the induced voltage is proportional to the frequency:

$$U=d\varphi/dt, \varphi(t)=\varphi 0 \sin(\omega t) \Rightarrow U=\varphi 0\omega \sin(\omega t)$$

For a given sinusoidal magnetic alternating flux having the amplitude $\varphi 0$, the induced voltage amplitude to be measured is proportional to the angular frequency $\omega$. If the aim is to design an inductive sensor using inexpensive and small inductances, in particular planar, i.e. printed-circuit-board-integrated, inductances, then operating frequencies of 500 kHz or more are desirable, because only then is an attractive combination of costs, dimensions and signal amplitude achieved. There is thus a yawning gap of more than three powers of ten between the frequency band accessible to dithering based on the prior art and the target frequency band for inductive sensors. This gap can by no means be closed by trimming all parameters involved in the computation to somewhat more favourable values.

The problem can be solved and an inductive sensor with dithering can be constructed from a simple microcontroller by virtue of dithering being implemented without the averaging used on the basis of the prior art. Expressed another way, by virtue of an operation being implemented that allows an action equivalent to dithering without averaging. In this regard, the following steps are carried out, for example:

If the chosen operating frequency is so high that the Nyquist frequency of the ADC is below it even at the maximum possible sampling rate, then undersampling is used specifically. In this case, the signal of the stimulus appears as a result of aliasing at a frequency below the respective Nyquist frequency at the output of the ADC; in this case, aliasing is thus not interference or an exclusion criterion, but rather is desired. In what follows, a measured frequency or a measured signal is now discussed. This means the operating frequency or a signal at this frequency if no undersampling was necessary, or the frequency produced by aliasing or a signal at this frequency if undersampling was used.

In order to obtain the desired result, spectral evaluation of the measured samples in the measurement interval takes place instead of the averaging. In this regard, it is particularly advantageous if an integer number of periods of the measured signal is present in the measurement interval. The number of samples in the measurement interval, the sampling rate and the operating frequency should be chosen such that this condition is satisfied. The effect achieved by this is that continuous measurement results in the phase angle of the measured signal being the same in each measurement interval and there being no sudden phase change between start and end within a measurement interval.

The spectral evaluation is preferably effected by DFT (discrete Fourier transformation) or a comparable operation that can be used to produce a spectrum showing the amplitudes of the measured signal for discrete values of the frequency. These amplitudes can be computed as real or complex values in this case. Complex values can be depicted as real and imaginary parts or absolute value and phase. To implement such an operation, algorithms such as e.g. FFT ("fast Fourier transformation") or the Goertzel filter are available, which does not determine the complete spectrum, but rather only the amplitude for one frequency.

To determine the amplitude at the operating frequency by means of spectral evaluation, it is sufficient if this amplitude changes only negligibly within the measurement interval. However, the change of amplitude determined by the measured variable is dependent on the application and takes place much more slowly than the change in the instantaneous value of the signal at the operating frequency. The two rates of change are decoupled by the spectral evaluation, so that the operating frequency is no further limit for the choice of measurement interval, or vice versa. All the statements made above in regard to the relationship between operating frequency and measurement interval now only apply to the highest frequency of the measured variable.

The value of the measured variable influencing the magnetic field at the operating frequency is finally preferably computed from the amplitude at the measured frequency. In the simplest case, the two are proportional. However, they may also be linked by any monotonous mathematical function. When there are multiple channels, i.e. multiple secondary inductances of a sensor as in FIG. 2, the function has the same number of variables as there are channels present. The multiple channels can be used particularly advantageously for differential or ratiometric measurements.

Figure 2:
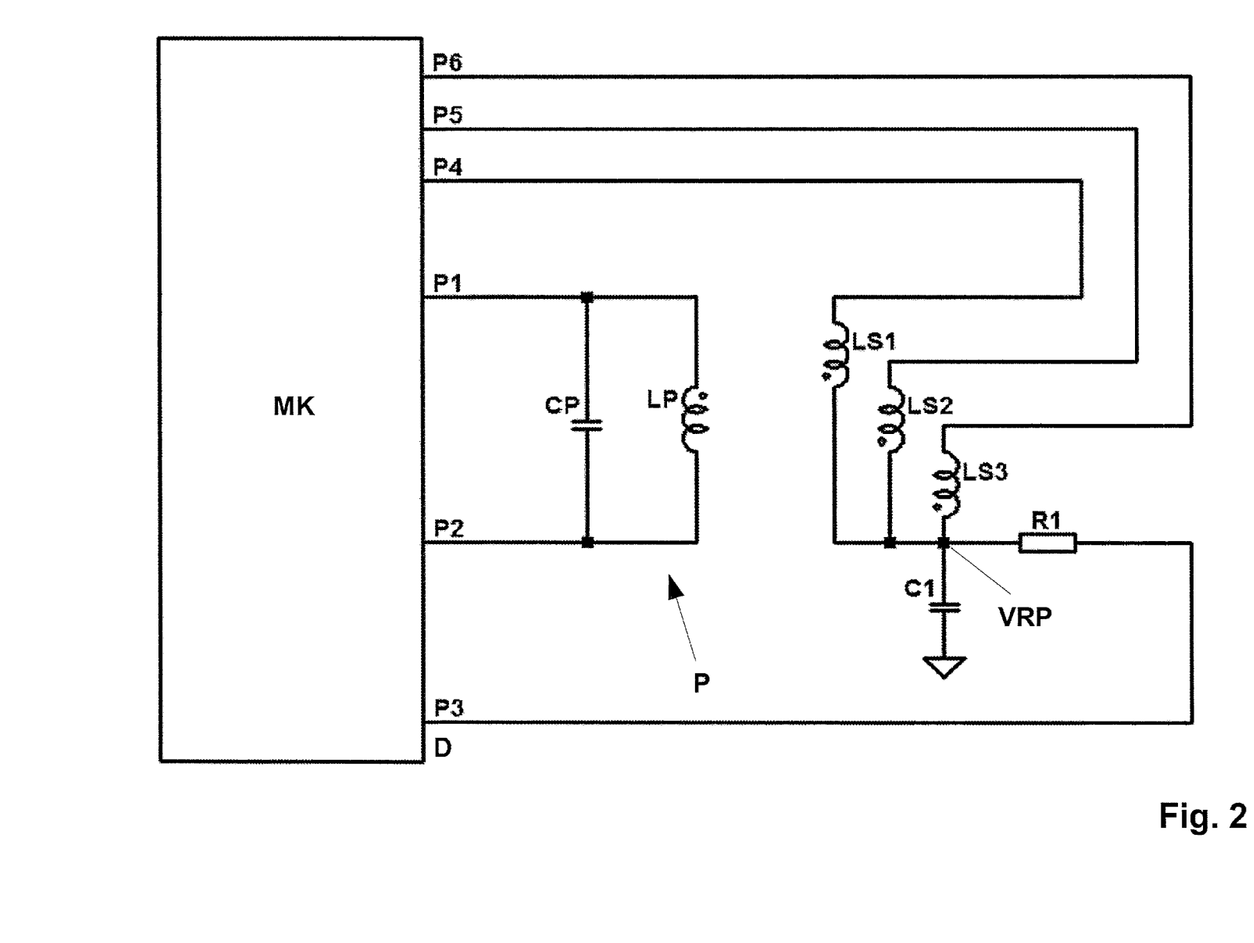
FIG. 2: shows an apparatus for measuring a measured variable.

The dithering itself is effected preferably by virtue of the distortion signal, as also in the case of the other methods, being added to the signal at the operating frequency, particularly preferably as depicted in FIG. 2.

There, the port pin P3 is used in order to apply a square-wave voltage, which is shaped by R1 and C1 to produce an approximate triangular-waveform voltage of very much smaller amplitude that becomes effective at the common node of the secondary inductances LS1 to LS3. The associated time constant RC should therefore be chosen to be high in comparison with the period of the voltage at P3. This period should be chosen to be so high that as many different values of the distortion signal as possible occur in the measurement interval, that is to say the distortion signal repeats itself little to not at all in the measurement interval. Since the signal is supposed to be periodic, this can advantageously be achieved by an integer number of half-cycles of the voltage at P3 in the measurement interval, which is preferably one or two. This is not imperative, however, since not necessarily the entire operating cycle of the sensor is taken up by the measurement interval. The measurement interval can thus also comprise e.g. only part of a half-cycle at P3. In every case, the aim of supplying the common node of the secondary inductances LS1 to LS3 with an AC voltage is that different samples in each measurement interval experience different values of this AC voltage in a deterministic manner, as a result of which the voltage is shifted by fractions of an LSB in each case. This achieves the effect of dithering.

It should be mentioned that the DFT is a transformation in which the result of any point in the spectrum is dependent on all points in the input sequence in the same manner. Thus, a type of averaging of the points of the spectrum takes place if an amplitude changes during the interval of the input sequence. In this sense, the solution presented here is not effected without averaging, but rather simple formation of the arithmetic mean was replaced by another kind of averaging.

It should be pointed out that the inventor of the present application has recognized in particular that the use of inductive sensors in conjunction with dithering for high-frequency AC voltages and the associated signal processing is of high technical and commercial significance. Exemplary applications are the measurement of distance or position and angle, particularly in motor vehicles. An example is the measurement of the position of the pressure piston in the main brake cylinder of a passenger vehicle.

Further possible features are described in structured fashion below, these features being able to be combined with one another and with the other features described herein arbitrarily.

The analog-to-digital converter may in particular be designed as part of a microcontroller. Likewise, the distortion signal generator may be part of the microcontroller. This allows a particularly compact and advantageous embodiment.

By way of example, the distortion signal generator may be implemented by means of a digital output of the microcontroller that forms the distortion signal output.

The analog-to-digital converter can have a differential input, the distortion signal output being coupled to a port of the differential input.

The distortion signal output and a reference potential, preferably ground, may have a voltage divider connected between them, the port of the differential input being connected to an output of the voltage divider.

The port of the differential input and the reference potential may have a capacitor connected between them that preferably spans at least one resistor of the voltage divider.

The analog-to-digital converter may have a reference input in addition to the signal input, the distortion signal output being coupled to the reference input.

The distortion signal output and a reference potential, preferably a positive potential, may have a voltage divider connected between them, the reference input being connected to an output of the voltage divider.

The reference input and the reference potential may have a capacitor connected between them that preferably spans at least one resistor of the voltage divider.

The distortion signal output and a signal port delivering the signal may be coupled to the signal input.

The distortion signal output may have DC voltage coupling, preferably conductive coupling, to the signal input, and the signal port may have AC voltage coupling, preferably capacitive coupling, to the signal input.

The distortion signal output and the reference potential, preferably ground, may have a voltage divider connected between them, the signal input being connected to an output of the voltage divider.

A resistor of the voltage divider that is connected between the distortion signal output and the output of the voltage divider may be larger than a resistor that is connected between the output of the voltage divider and the reference potential.

The microcontroller may be, in particular, the electronic control unit.

The parallel resonant circuit may be connected to a first port pin and to a second port pin of the electronic control unit, the second port pin being supplied with a clock that is inverted in relation to the first port pin.

The parallel resonant circuit may be connected in parallel with the first port pin to a number of further first port pins that are connected to the first port pin in sync. The parallel resonant circuit may also be connected in parallel with the second port pin to a number of further second port pins that are connected to the second port pin in sync.

Port pins to which the parallel resonant circuit is connected may advantageously have a push-pull output stage or a tri-state output stage.

The excitation frequency differs from a resonant frequency of the parallel resonant circuit preferably by no more than 25%, particularly preferably no more than 20%, more preferably no more than 15% and even more preferably no more than 10%.

The measurement inductance can have a first pole connected to a port pin of the electronic control unit and a second pole connected to a potential that corresponds to at least approximately half the supply voltage of the electronic control unit.

The potential that corresponds to at least approximately half the supply voltage of the electronic control unit can be produced by means of a voltage divider, in particular.

The potential that corresponds to at least approximately half the supply voltage of the electronic control unit can be produced by means of a smoothing capacitor, wherein the smoothing capacitor has a first pole connected to a reference-ground potential or to the supply voltage, and wherein a second pole of the smoothing capacitor is connected via a resistor to a port pin of the electronic control unit, which port pin has a pulsed signal, in particular a signal having a prescribable duty ratio, applied to it.

The electronic control unit may preferably be configured to first of all, when it is switched on, charge the smoothing capacitor to at least approximately half the supply voltage, while port pins to which the parallel resonant circuit is connected have the same logic level, to begin excitation of the parallel resonant circuit only afterwards.

A signal produced by the measurement inductances can be captured in particular using an analog-to-digital converter of the electronic control unit and can be determined taking into consideration aliasing of the characteristic values of said signal, in particular amplitude, phase, real part and/or imaginary part, specifically preferably at the excitation frequency or at an alias of the excitation frequency.

A frequency component at an evaluation frequency can be ascertained from a signal captured in the electronic control unit, wherein the evaluation frequency is in particular the excitation frequency or an alias of the excitation frequency.

The measurement inductance may be coupled to the first inductance conductively or magnetically.

The parallel resonant circuit preferably has a maximum Q factor obtained by maximizing a value of Vt*Vt/V0, where Vt denotes a ratio of coil current and supply line current for a maximum disparity of the capacitance and the first inductance from their respective values at the resonant frequency of the parallel resonant circuit, and where V0 denotes a ratio of coil current and supply line current for respective values of capacitance and first inductance at the resonant frequency of the parallel resonant circuit.

The measured variable can preferably be sensed by altering a position of a magnetic core in the measurement inductance, by altering a distance between measurement inductance and first inductance and/or by altering a position of a magnetic and conductive, non-magnetic and conductive or magnetic and nonconductive element adjacent to the measurement inductance and the first inductance.

The apparatus can have one, two, three or more than three measurement inductances.

A magnetic and conductive element may be made from steel, for example. A non-magnetic and conductive element may be made from aluminum, for example. A magnetic and non-conductive element may be made from ferrite, for example.

The electronic control unit may be designed as an application-specific integrated circuit, ASIC, and/or as an application-specific standard product, ASSP, for example.

The electronic control unit can have a direct digital synthesis (DDS) module, for example, in order to generate the excitation frequency.

The electronic control unit may be configured to alter the excitation frequency in order to ascertain a resonant frequency of the parallel resonant circuit, and to set the excitation frequency to be identical to the resonant frequency or adjacent to the resonant frequency.

The electronic control unit may be configured to identify when an exceeding of a maximum level has occurred or is imminent on a port pin, and to respond thereto by changing the excitation frequency, in particular by spacing it further apart from the resonant frequency of the parallel resonant circuit.

The electronic control unit may be configured to carry out interference rejection, to which end the excitation frequency is continuously varied within a measurement interval and/or the excitation frequency is varied within a measurement interval and a signal-to-noise ratio is ascertained on the basis of the excitation frequency, the excitation frequency subsequently being set to a value having a maximum signal-to-noise ratio.

The electronic control unit can have at least one analog multiplier connected to a port pin for connecting the measurement inductance and to a signal module, wherein the signal module delivers an oscillating signal at a frequency at a defined, in particular short, distance from the excitation frequency, wherein the signal module is preferably designed as a direct digital synthesis (DDS) module, and wherein an output signal from the analog multiplier, in particular a difference signal, continues to be used in the electronic control unit to ascertain the measured variable.

The possible embodiments, features and variants described can be combined in an arbitrary manner with other embodiments and variants and also exemplary embodiments described herein, but they may also be separate elements essential to aspects of the invention or else elements essential to aspects of the invention in any combination or separate elements essential to aspects of the invention.

BRIEF DESCRIPTION OF THE DRAWINGS

Further features and advantages will be gathered by a person skilled in the art from the exemplary embodiments described below with reference to the appended drawing, in which.

DETAILED DESCRIPTION OF THE PREFERRED EMBODIMENTS

Figure 1:
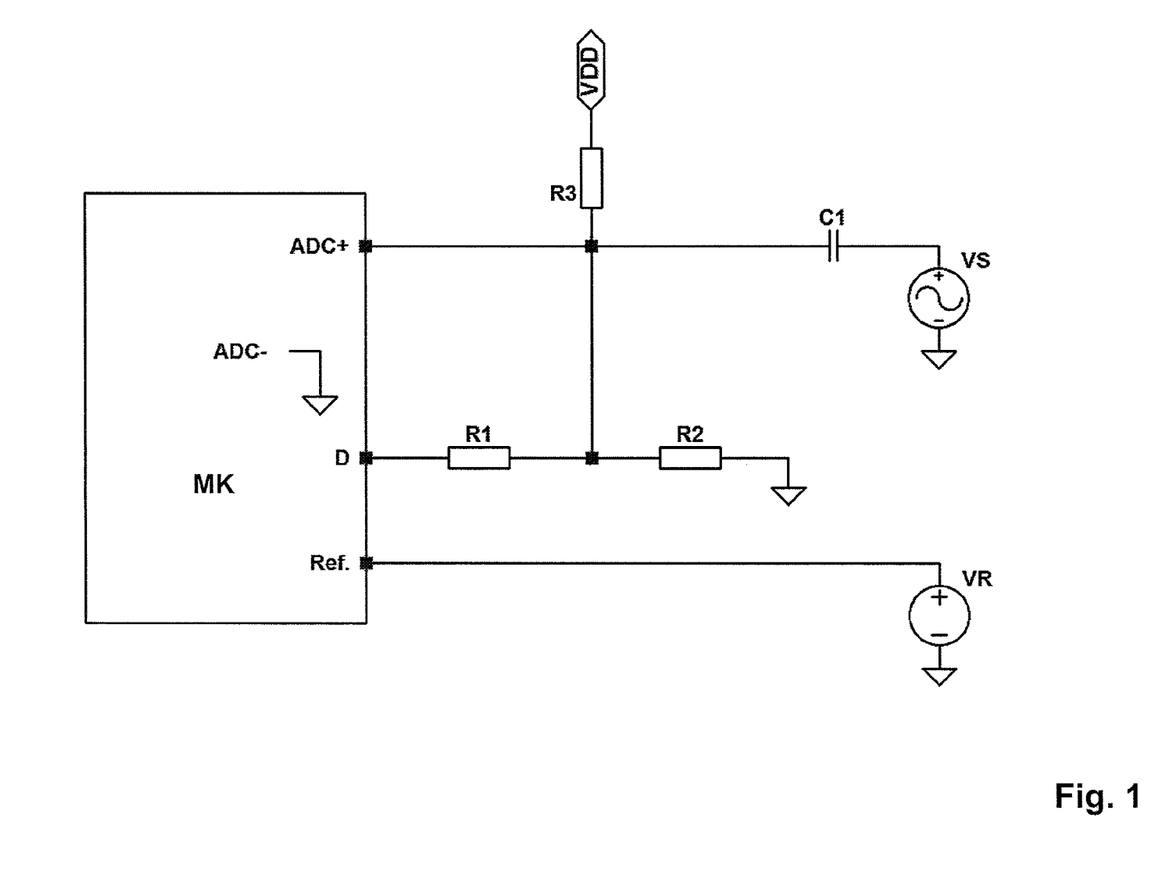
FIG. 1: shows a microcontroller with external circuitry.

FIG. 1 shows a microcontroller MK with external circuitry. The microcontroller MK has a reference input Ref. that is at a defined voltage VR. The microcontroller MK has a distortion signal output D designed to output a distortion signal. The distortion signal output D is connected to a voltage divider formed from a first resistor R1 and a second resistor R2, which are connected in series with one another and are connected to ground opposite the distortion signal output D.

In addition, the microcontroller MK has an analog-to-digital converter having a signal input ADC+. The analog-to-digital converter is integrated in the microcontroller MK and, in addition to the signal input ADC+, further has a negative input ADC−, which is not accessible from the outside in this case, however, and is connected to ground inside the microcontroller. The voltage present at the reference input Ref., which is delivered by a DC voltage source conventionally connected to the reference input Ref., is a reference voltage of the analog-to-digital converter.

The external circuitry shown in FIG. 1 is designed to measure a signal voltage VS. The latter is depicted as an AC voltage in the present case, but may fundamentally be an output voltage of a sensor or of another unit to be monitored or to be measured.

The signal voltage VS is capacitively coupled via a capacitor C1 to the positive signal input ADC+ of the analog-to-digital converter. Thus, only the AC voltage component of VS can act on the analog-to-digital converter, and also only this component can be measured. The signal input ADC+ is further connected directly, that is to say conductively, to a point between the first resistor R1 and the second resistor R2 of the voltage divider already described earlier on, and is further connected to the supply voltage VDD via a third resistor R3. The network of the three resistors R1, R2, R3 determines the DC voltage potential at the positive signal input ADC+. The distortion signal output D typically delivers a square-wave signal that influences this potential. The frequency bands of the two signals should be separate for optimum results. The first resistor R1 is usually chosen to be very much larger than the second resistor R2 and the third resistor R3, because the voltage at the distortion signal output D is supposed to shift the DC voltage potential of the positive signal input ADC+ only by a few millivolts, whereas the second resistor R2 and the third resistor R3 adjust the potential in the entire supply range.

Fundamentally, the circuit shown in FIG. 1 allows measurement of a signal voltage VS when overlaid with a distortion signal provided by the distortion signal output D. Both production of the distortion signal and digitization of the overlaid signal take place in the microcontroller MK. The two signals, that is to say the distortion signal and the signal voltage to be measured, are coupled to the signal input ADC+ without active components, that is to say in particular without operational amplifiers and without active adding circuits, conductive coupling and capacitive coupling being used in the present case.

FIG. 2 shows an exemplary embodiment in which the inductive system is implemented by means of transformer. In this case, a microcontroller MK is likewise provided that has a number of six port pins P1, P2, P3, P4, P5, P6.

The first and second port pins P1, P2 have a parallel resonant circuit P connected to them that has a first inductance LP and a capacitance CP. Appropriate connection of the two first and second port pins P1, P2 to an excitation frequency derived from a clock of the microcontroller MK allows the parallel resonant circuit P to be excited into oscillation.

The third port pin P3 of the microcontroller MK acts as a distortion signal output D. The third port pin P3 has a resistor R1 connected to it that forms a distortion signal reference point VRP at its opposite pole. The distortion signal reference point VRP is also connected to ground via a smoothing capacitor C1. Applying a pulsed signal to the distortion signal output D allows the mean voltage at the distortion signal reference point VRP to be set very accurately. In particular, said mean voltage can be set to approximately half the supply voltage of the microcontroller MK, the AC voltage component of said half supply voltage being able to be the distortion signal. The distortion signal may be a sawtooth signal or a triangular-waveform signal, for example.

The distortion signal reference point VRP has a first measurement inductance LS1, a second measurement inductance LS2 and a third measurement inductance LS3 connected to it. These have respective opposite poles connected to the fourth port pin P4, the fifth port pin P5 and the sixth port pin P6. These therefore serve as signal inputs.

The first inductance LP, on the one hand, and the three measurement inductances LS1, LS2, LS3, on the other hand, have magnetic coupling between them that can be influenced by an element, not depicted. This element is dependent on a variable to be measured. By way of example, a position of a piston in a brake cylinder can be monitored, the magnetic coupling between the first inductance LP and the three measurement inductances LS1, LS2, LS3 being dependent on this position. Therefore, the position of the piston in the brake cylinder can fundamentally be measured by monitoring the three measurement inductances LS1, LS2, LS3.

The apparatus shown allows in particular the performance of a measurement using aliasing, as described in detail earlier on. A repetition is dispensed with at this juncture.

It should be mentioned that instead of the connection of each of the measurement inductances LS1, LS2, LS3 to a respective port pin P4, P5, P6 it is also possible for measurement inductances to be connected in series and for respective voltage tapping to take place at connecting points between measurement inductances. This allows respective voltage drops across measurement inductances to be computed by difference formation.

Figure 3:
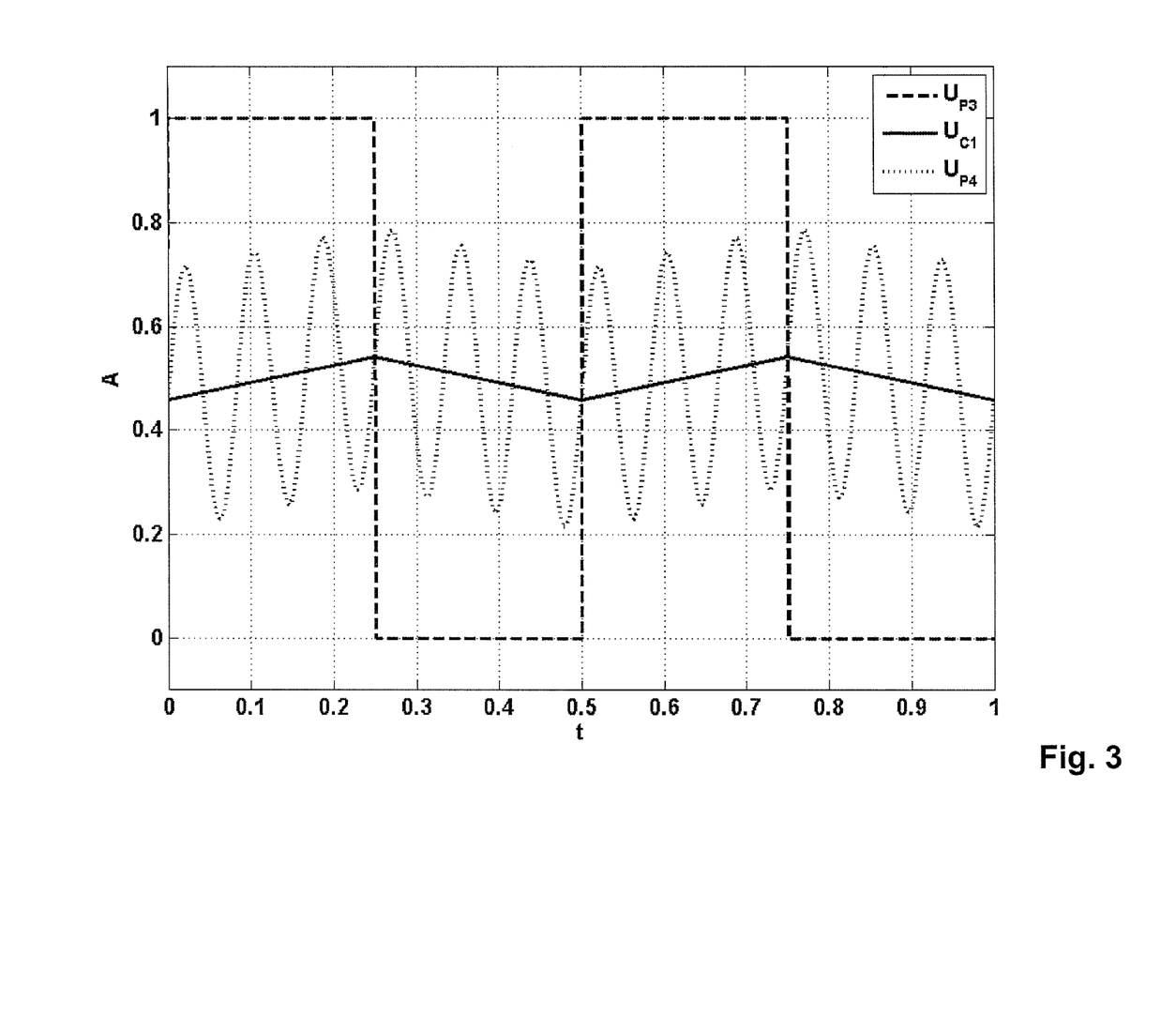
FIG. 3: shows signal profiles as a function of time.

FIG. 3 shows three signal profiles as a function of time. In this case, time is depicted in arbitrary units from 0 to 1. Amplitude is also depicted in arbitrary units from 0 to 1. Time is depicted on the horizontal axis and denoted by t. Amplitude is depicted on the vertical axis and denoted by A.

FIG. 3 first of all shows the voltage signal $U_{P3}$, which is a square-wave voltage, present at the distortion signal output D or P3. In addition, the signal $U_{C1}$ present at the distortion signal reference point VRP or on the further capacitor C1 is shown. This is, as can be gleaned from FIG. 3, a triangular-waveform signal oscillating back and forth around a mean value. It is thus a constant signal, which is at least approximately or even completely consistent with half the supply voltage of the microcontroller MK, overlaid with a distortion signal.

In addition, the signal present at the fourth port pin P4 is depicted by way of example. This signal is denoted by $U_{P4}$. It can be seen that it is a sine curve and is much faster than the other two signals. This signal can be used to determine the measured variable. As shown, the signal determined by the measured variable is overlaid with the distortion signal.

The claims that are part of the application do not represent any dispensing with the attainment of further protection.

If it turns out in the course of the proceedings that a feature or a group of features is not absolutely necessary, then the applicant aspires right now to a wording for at least one independent claim that no longer has the feature or the group of features. This may be, by way of example, a subcombination of a claim present on the filing date or may be a subcombination of a claim present on the filing date that is limited by further features. Claims or combinations of features of this kind requiring rewording can be understood to be covered by the disclosure of this application as well.

It should further be pointed out that configurations, features and variants of aspects of the invention that are described in the various embodiments or exemplary embodiments and/or shown in the figures can be combined with one another in any way. Single or multiple features can be interchanged with one another in any way. Combinations of features arising therefrom can be understood to be covered by the disclosure of this application as well.

Back-references in dependent claims are not intended to be understood as dispensing with the attainment of independent substantive protection for the features of the back-referenced subclaims. These features can also be combined with other features in any way.

Features that are disclosed only in the description or features that are disclosed in the description or in a claim only in conjunction with other features may fundamentally be of independent significance essential to aspects of the invention. They can therefore also be individually included in claims for the purpose of distinction from the prior art.

The invention claimed is:

1. An apparatus for measuring a measured variable, comprising:
   a first inductance,
   at least one measurement inductance to sense the measured variable and coupled to the first inductance,
   a capacitance interconnected with the first inductance to form a parallel resonant circuit, and
   an electronic control unit,
   wherein the electronic control unit is connected directly to the parallel resonant circuit and is configured to excite the parallel resonant circuit into oscillation at an excitation frequency that is derived from a clock of the electronic control unit,
   wherein the electronic control unit has at least one analog-to-digital converter having a signal input connected directly to the at least one measurement inductance for picking up a signal,
   wherein the electronic control unit has a distortion signal generator having a distortion signal output, the distortion signal generator delivering a distortion signal at a distortion signal reference point,
   wherein the distortion signal output is coupled to the analog-to-digital converter exclusively by passive components,
   wherein the electronic control unit is configured to measure the signal at intervals, a number of measured values being picked up within each interval, and
   wherein the electronic control unit is configured to perform a frequency analysis of the measured values of a respective interval and to determine at least one characteristic value, indicating the measured variable, of the signal at an evaluation frequency.

2. The apparatus as claimed in claim 1,
   wherein the measured values are spaced apart by respective time differences, these being consistent with an undersampling of the signal.

3. The apparatus as claimed in claim 2,
   wherein the evaluation frequency is the excitation frequency.

4. The apparatus as claimed in claim 1,
   wherein the evaluation frequency is the excitation frequency.

5. The apparatus as claimed in claim 1,
   wherein the evaluation frequency is an alias of the excitation frequency.

6. The apparatus as claimed in claim 1,
   wherein a respective measurement interval comprises an integer number of periods of the signal.

7. The apparatus as claimed in claim 1,
   wherein a respective measurement interval has an integer number of half-cycles of the distortion signal, preferably one or two half-cycles.

8. The apparatus as claimed in claim 1,
   wherein the distortion signal output is coupled to the analog-to-digital converter without active components, in particular without operational amplifiers.

9. The apparatus as claimed in claim 1,
   wherein the measurement inductances have a respective first pole connected to a respective signal input of the electronic control unit, and have a respective second pole connected to a common potential point.

10. The device as claimed in claim 9,
    wherein at least approximately half of a supply voltage of the electronic control unit is present at the potential point.

11. The apparatus as claimed in claim 10,
    wherein the potential point is the distortion signal reference point.

12. The apparatus as claimed in claim 10,
    wherein a resistor is connected between the distortion signal output and the potential point, and
    wherein the potential point is connected to a reference-ground potential or to the supply voltage via a smoothing capacitor.

13. The apparatus as claimed in claim 9,
    wherein the potential point is the distortion signal reference point.

14. The apparatus as claimed in claim 13,
    wherein a resistor is connected between the distortion signal output and the potential point, and
    wherein the potential point is connected to a reference-ground potential or to the supply voltage via a smoothing capacitor.

15. The apparatus as claimed in claim 9,
    wherein a resistor is connected between the distortion signal output and the potential point, and
    wherein the potential point is connected to a reference-ground potential or to the supply voltage via a smoothing capacitor.

16. The apparatus as claimed in claim 9, wherein a pulsed signal, having a prescribable duty ratio, is present at the distortion signal output.

17. The apparatus as claimed in claim 1, wherein the characteristic value is at least one of an amplitude, a phase, a real part or an imaginary part.

* * * * *